Oct. 17, 1972 P. T. ROBINSON 3,698,985

HIGH SPEED MACHINE FOR BONDING FRAME LEADS TO BONDING PADS ON CIRCUIT CHIPS

Filed March 25, 1970 2 Sheets-Sheet 1

INVENTOR.
Peter T. Robinson

BY
Mueller, Aichele & Rauner
ATTY'S.

INVENTOR.
Peter T. Robinson
BY
Mueller, Aichele & Rauner
ATTY'S.

United States Patent Office
3,698,985
Patented Oct. 17, 1972

3,698,985

HIGH SPEED MACHINE FOR BONDING FRAME LEADS TO BONDING PADS ON CIRCUIT CHIPS

Peter T. Robinson, Scottsdale, Ariz., assignor to Motorola, Inc., Franklin Park, Ill.

Filed Mar. 25, 1970, Ser. No. 22,446
Int. Cl. B32b *31/16*
U.S. Cl. 156—379 9 Claims

ABSTRACT OF THE DISCLOSURE

A machine is provided for properly positioning a chip with respect to a frame member and for simultaneously bonding all frame member lead ends to respective bonding pads of a semiconductor integrated circuit chip. The machine features a rough orientation and a close orientation of the chip to cause registering of the chip pads with the lead ends, both orientations being visual. During the orientation process, the chip pads are visible and during the close orientation process, the relative position of the chip pads and the lead ends are visible. Many sheet frame members are provided in strip form, said strip being supplied rolled up on a reel. As the pads on a chip are bonded to the ends of the leads, the strip may be rolled up on another reel for transportation purposes.

BACKGROUND

Figure 1:
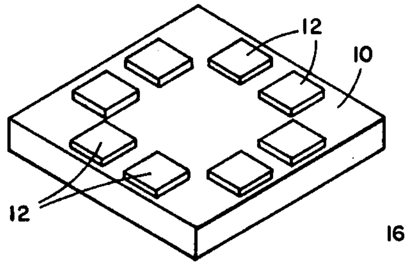

This invention relates to bonding of bonding pads on chips which have electronic circuits applied thereto to leads which comprise part of a lead frame.

Various methods have been proposed for providing electrical connections between the ohmic contact areas or bonding pads of an integrated circuit chip and the external package leads. The most common method involves thermo-compression bonding of extremely fine wires between the bonding pads on a chip and the leads of the package. In accordance with this technique, a 14-lead device, for example, requires 28 separate bonding steps, each requiring a careful positioning of partially assembled devices in the bonding apparatus.

The industry has recognized for some time that it would be desirable to eliminate the time and expense of wire bonding. Considerable attention has been devoted to the expedient of simply extending the internal portion of the package leads and tapering the lead ends to provide bonding tips which are small enough for attachment directly to the bonding pads of the semiconductor circuit deposited on a chip. This approach has not been successful primarily due to the fundamental difference in structural specifications required for external package leads as compared to the specifications required for internal leads bonded to the ohmic contact bonding pads of the chip.

For example, the use of external package leads made of 10-mil Kovar has become a standard practice for many devices. Efforts to bond 10-mil Kovar leads directly to the bonding pads of a chip have proved disappointing. High speed techniques for gold or aluminum wire bonding such as thermal compression and vibratory pressure bonding, do not readily produce a reliable bond when applied to leads as thick as 10-mils, or when applied to metal leads which are less ductile than gold, aluminum or copper, for example. Even when acceptable bonds are initially formed using 10-mil lead frames, the leads are very succeptible to inadvertent detachment from the bonding pad as a result of subsequent stresses introduced by normal handling and coincidental flexing of the assembly.

It has also been proposed to replace bonding wires with individual rigid metal clips for interconnecting the bonding pads of the semiconductor circuit with the external leads. This approach may be advantageous for some applications, but it has not been found to reduce the cost of assembly substantially.

A very thin lead frame having externally extending leads, one for each bonding pad on the chip, has been developed for connecting the respective bonding pads to package leads. The lead frame may be made of aluminum which is 2 mils thick and is therefore very pliable. A great many lead frames may be formed into a strip and the strip may be supplied rolled up on a reel. For bonding the inner ends of the leads of the lead frame to the bonding pads on the chip, the lead frame is supplied in such form that when a chip is put over a lead, the chip can be so positioned that the bonding pads register with the inner ends of the leads. After such positioning, all lead ends can be bonded to respective bonding pads simultaneously by thermal compression bonding or by vibration and pressure bonding. Such registering of lead frame ends and bonding pads is very difficult and time consuming since not only must the chip and the lead frame be properly registered with respect to each other but they must be positioned in line with or on an anvil and the back of the chip must be in line with a bonding post. It is noted that a typical chip may be about 1/30 of an inch square and may have about 24 bonding pads thereon and that the leads comprising parts of the lead frame are of commensurate size.

A method of bonding all the frame lead ends to corresponding bonding pads on a chip is disclosed in the Helda and Geyer application entitled "Apparatus for Connecting Lead Portions of a Lead Frame to Respective Pads on a Chip," and assigned to Motorola, Inc., the assignee of this application. In accordance with the said application, the chip is operated on while upside down, and since the operator cannot see the bonding pads, the first or rough location and/or orientation of the chip is made by reference to the outside dimensions of the chip (not by reference to the pads on the chip) whereby, since all chips are not exactly the same in size and shape, the rough location may be very rough. Also, since the chip is not symmetrical about a center point thereof, the rough orientation may be totally incorrect unless the chips were properly oriented within less than 45 degrees before they were placed on the machine. Furthermore, an electronic comparison receiver is provided which provides close orientation of the chip to a standard and not to the inner ends of the leads to which the pads on the chip are to be connected.

It is an object of this invention to provide an improved apparatus for registering lead ends of a lead frame with bonding pads on a chip and for bonding the lead ends to the respective pads.

It is another object of this invention to provide an apparatus for registering lead ends of a lead frame with bonding pads on a chip and in which the orientation and location resulting in the registering is accomplished by visibly observing the chip both alone and in relation to the position of the lead ends.

SUMMARY

The lead frames are supplied in strip form whereby a great many frames are supplied in one strip. The strip may be provided wound up on a reel. The strip is advanced one lead frame at a time to a position where the inner ends of the lead frame is over a moveable bonding post. In accordance with this invention, a chip is provided face up and is pointed in the right direction and is roughly oriented at a distance from the bonding post by visually observing the chip and by moving the chip with respect to a reticle. The chip is then placed on the bonding post and is closely oriented and positioned with respect to the inner ends of the frame leads by moving the bonding post in the X, Y and theta directions. An anvil is then placed over the ends of the frame leads and the post is moved up to a bonding position at which, by application of pressure and vibration, each lead end is bonded to a respective bonding pad, all bonds being made simultaneously. Due to the fact that the lead ends are expanded by compression and that the outer ends of the leads are constrained by the frame, the leads are looped or humped. A humping ring may be provided surrounding the bonding post to give uniform curvatures to all the leads out of the plane of the frame to assure that the leads touch no part of the chip except their respective bonding pads, to prevent short circuit of the chip by the leads.

DESCRIPTION

Figure 2:
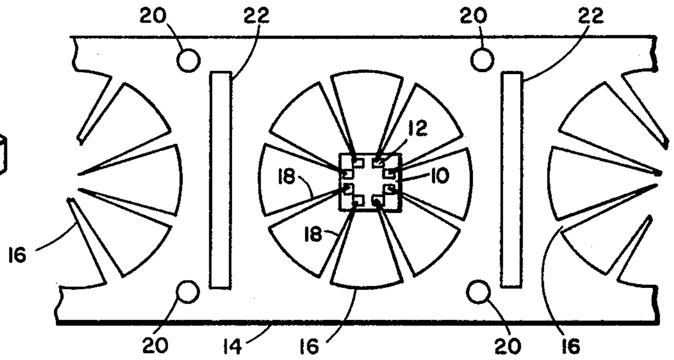
Figure 3:
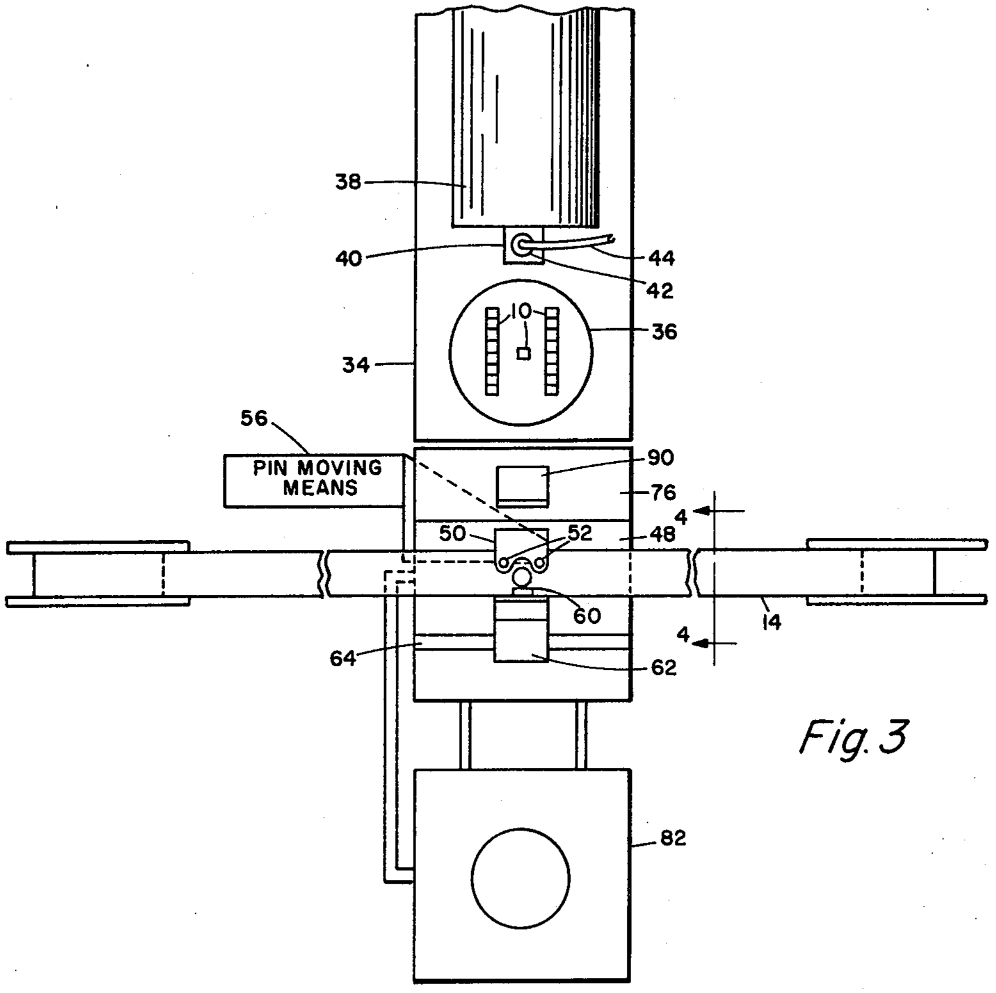
Figure 4:
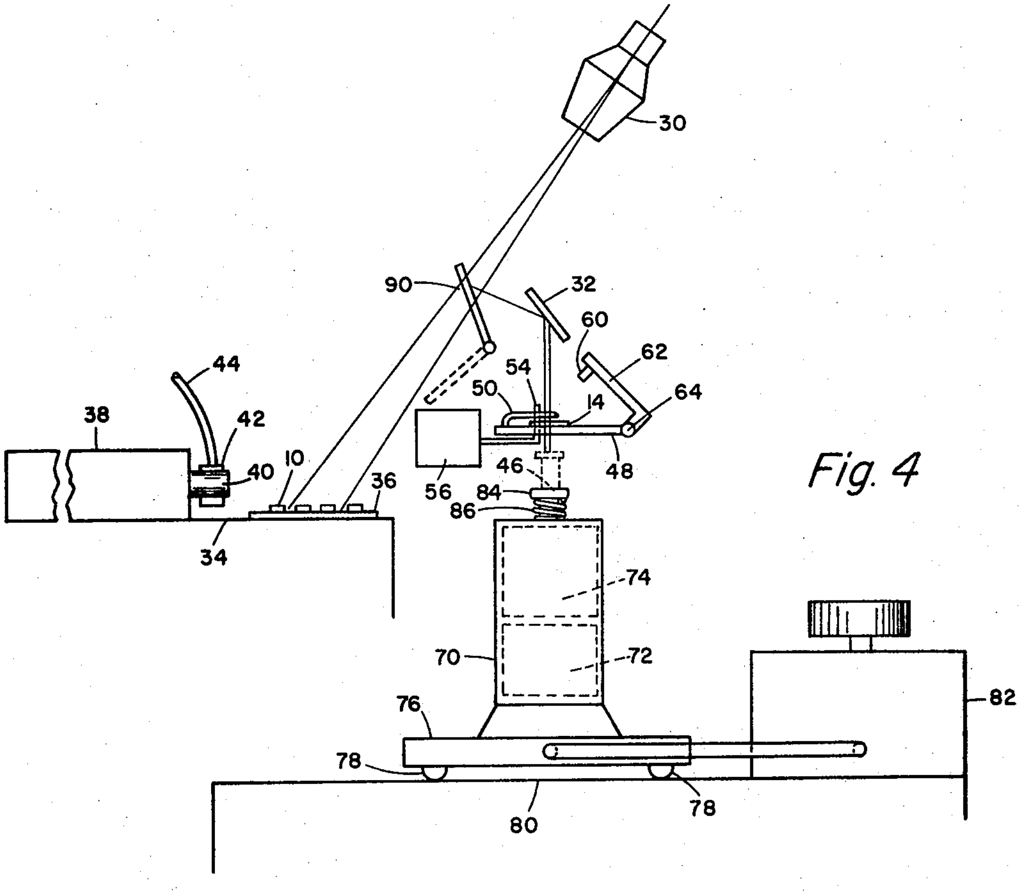
Figure 5:
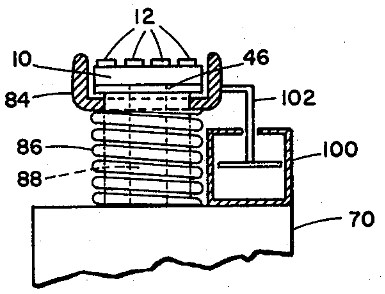
Figure 6:
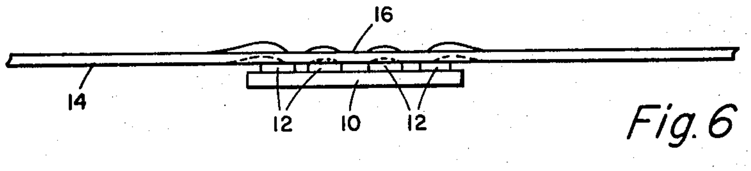

The invention will be better understood upon reading the following description in connection wtih the accompanying drawing in which:

FIG. 1 illustrates a chip having bonding pads thereon,

FIG. 2 illustrates a strip of lead frames and also shows a chip with its bonding pads bonded to the ends of the inwardly extending leads of the lead frame, FIG. 3 is a plan view of a semi-automatic machine for bonding the ends of the leads to the bonding pads, certain optical equipment that is shown in FIG. 4 being omitted from FIG. 3 for convenience of illustration, FIG. 4 is a view of the machine of FIG. 3 on the line 4—4 of FIG. 3 and looking in a direction of the arrows, FIG. 5 is a fragmentary view of the bonding post and the humper ring in their relative position and at a larger scale, and FIG. 6 shows a view of the chip and the lead frame bonded thereto and the loops or humps produced in the leads by the bonding apparatus.

Turning first to FIG. 1, the top of a chip 10 is shown. Besides having a circuit (not shown) deposited on the face of the chip 10, a number of bonding pads 12 are applied to the face of the chip along the edges thereof but spaced slightly inwardly from the edges of the chip. The bonding pads 12 are terminals for the circuit (not shown) on the chip 10. The pads 12 may be raised about 1 or 2 microns above the surface of the chip. While 8 pads 12 are shown, any number thereof may be used, 24 being a typical number.

As shown in FIG. 2, a strip 14 of leads frames 16 is provided. While only one lead frame and two partial lead frames are shown in FIG. 2, it will be understood that as many lead frames 16 are provided in the strip 14 as is convenient. If the lead frames of FIG. 2 are to be used with the chip of FIG. 1, the lead frame 16 includes 8 inwardly extending leads 18 and the inner ends of the leads register with the pads on a chip 10 when the chip 10 is properly oriented or positioned with respect to the frame 16. There will be as many leads 18 in a frame 16 as is required to make proper connection to the chip 10. The strip 14 is very flexible, being of aluminum about 2 mils thick whereby it can be supplied on a reel. Furthermore, since the chip 10 is so small with respect to the frame 16 to which it is connected, after the bonding pads 12 of the chip 10 have been bonded to the inner ends of the leads 18, as shown in FIG. 2, the strip 14 with the chips 10 bonded thereto can be rolled up on another reel for transportation without harming the frame 16, the leads 18, the chip 10 or their connections. Also, as will be made more clear, the leads 18 are very flexible whereby when they are bonded to the pads 12, handling of the strip 14 with the chip 10 attached thereto or of the strip 14 with the leads 18 forming a part thereof and further steps in the process to which the strip 14 and the chips 10 are subjected, will not destroy or harm the connection of the leads 18 to the pads 12 nor will they tear the leads 18 out of the frame 16.

The inventive machine for bonding the leads 18 to the bonding pads 12 is shown in FIGS. 3, 4 and 5. For convenience of illustration, the binocular microscope 30 and the fixed mirror 32 of FIG. 4 are not shown in FIG. 3.

At table 34 is provided on the front part of which a dish 36 of chips 10 are positioned with the bonding pads side up. A housing 38 is positioned on the back of the table 34. A carrier cylinder 40 moves in and out of the housing 38 and a hollow transport post 42 moves up and down with respect to the forward end of the cylinder 40. Suction is applied by a suction tube 44 to the transport post 42. As will be pointed out, the cylinder 40 and the post 42 move a roughly oriented chip 10 off the dish 36 and onto a bonding post 46 (see FIGS. 4 and 5).

A second table 48 is provided above and in front of the table 34. A locating plate 50 extends above and parallel to the table 48 and spaced therefrom a distance equal to the thickness of the strip 14. The plate 50 is fixed to the back of the table 48 as shown. The front of the plate 50, as shown in FIG. 3, is cut back to expose nearly a complete frame 16, and locating holes 52 (FIG. 3) are provided in the plate 52 to receive positioning pins 54 (FIG. 4) that extend through slots in the table 48, through two registering holes 20 that are provided near one edge of the strip 14 (see FIG. 2) and through the holes 52 in the plate 50. Pin moving means 56 are provided to so move the strip 14 that successive frames 16 are controllably positioned by the pins 54 over the bonding post 46. A bonding anvil 60 is mounted on one side of and near the rear end of a locatable support plate 62 which is itself mounted on the front end of the table 48 by means of hinges 64. By known means, not shown, the anvil 60 is moved between the positions shown in which it does not obstruct light used in closely locating or orienting a chip 10 to another position in which the anvil 60 extends through a hole in the table 48 and cooperates with the post 46 in bonding lead ends 18 to bonding pads 12 on a chip 10, as will be more fully explained.

The bonding post 46 is mounted for motion up and down with respect to a moveable housing 70 by known bond post moving means 72. The bonding post 46 is also vibrated by known vibrating means 74, also positioned in the housing 70. The housing 70 is positioned on a carrier 76 having ball bearing support 78 whereby the housing 70 may be moved about on the surface of the table 80 on which the carrier is placed. A known manual micro-manipulator 82 is provided, coupled to the carrier 76, to cause very fine motion of the carrier 76 and therefore of the bonding post 46 and therefore of the chip 10 which is positioned on the bonding post 46.

The top of the bonding post 46 is formed into a flange and acts as a stop for a humper ring 84, see FIGS. 4 and 5, a portion of which surrounds and extends above the top of the post 46 and also above the top of a chip 10 and the bonding pads 12 thereof that may be positioned on the post 46. A light spring 86 holds the ring 84 in its upper position but since the spring 86 is very light, the ring 84 supplies very light pressure to the leads 18 of the frame 16 while the post 46 is causing bonding of the lead ends 18 to the chip pads 12 as will be explained. Suction may be applied to a chip 10 that is on top of the post 46 by way of a hole 88 through a post 46 if desired.

The rough locating system comprises a pair of binocular microscopes 30, having a reticle, through which the chips 10 on the plate 36 may be observed. When the swinging mirror 90 is in the position shown in dotted lines, the tops of the chips 10 may be seen and a chip may be positioned and oriented with respect to the reticle in the microscope. When the swinging mirror 90 is in its position shown in solid line, light rays from the top of the chip 10 on the post 46 go through the hole in the table top 48 and through the interstices between the leads 18 and are reflected by the fixed mirror 32 and the swinging mirror 90 into the microscope 30. Since the light passes perpendicularly to the plane of the frame 18 and to the plane of the face of the chips 10, there is no parallax, whereby final or close positioning and orientation of the chip 10 with respect to the lead ends 18 may be accomplished by looking through the microscope 30 and operating the micromanipulator device 82.

In the operation of the described machine, the operator puts a dish of chips 10 on top of the table 34. Each chip has an arrow, indicating the direction of the top of the chip on the chip face. He then looks through the microscope 30 with a mirror 90 in its dotted position and he moves a chip 10 into a desired position with respect to the reticle in the microscope, either by moving the plate 36 or the chip 10, making sure that the arrow points in the correct direction. He then causes the mirror 90 to swing to its dotted position and causes the carrier 42 to pick up the chip 10 at the desired position and place it on the top of the bonding post 46 under the table 48. The operator then, by looking through the microscope and by use of the two mirrors 90 and 32, the mirror 90 being in the position shown in solid lines, sees superimposed images of the leads 18 and the pads 12. He then moves the carriage 76 by operating the micro-manipulator 82 to the point where the lead ends 18 are directly above the respective pads 12. Then the anvil 60 is swung into position, pushing the leads 18 downwardly slightly. The post 46 is made to go up and to vibrate and the pressure and vibration as between the leads 18 and the pads 12 cause bonding of the leads 18 to the respective pads 12. As pressure is applied to the lead ends 18, they expand in length and would bow out. However, the slight pressure provided by the humping ring 84 on the leads 18 cause them to take a uniform bow or hump shape, whereby the leads 18 are bonded to the pads 12 and across the edges of the chip 10 without touching the edges of the chip 10 and without danger of short circuit thereof. The pressure applied by the humping ring 84 is not great enough, however, to by itself distort the leads 18. The mirror 90 is then swung down to its dotted position, the anvil 60 is raised to the position shown in FIG. 4, the post 46 is dropped to its lowest position, the carrier 42 being in the position shown in FIG. 4 and the pin moving means 56 moves another frame in position over the table 48. The pins 54 which extend through the holes 20 along an edge of the strip 14 extend up through the holes 52 in the locating plate 50 to keep a frame in operating position. The cycle is over and a new cycle may be started.

If desired a dashpot 100, FIG. 5, may be provided to slow down the application of pressure by the humper ring 84 on the spider 16. The arm 102 of the dashpot 100 is fixed to the humper ring 84 and when the post 46 goes up, the dashpot 100 slows down the contact of the humper ring 84 with the spider 16 to make sure that the post 46 pushes the chip 12 far enough so that the chip pushes the lead ends 18 into contact with the anvil 60 before the humper ring 84 contacts the leads 18 to prevent any chance of displacement of the lead ends 18 by the humper ring 84.

What is claimed is:

1. Apparatus for bonding together in a single bonding operation, a plurality of conductive portions with an elongated member in strip form to a plurality of contact portions with a single electrical unit, said conductive portions each having an inner bonding end portion arranged in a single group corresponding to the contact portions on an electrical unit and being one of a plurality of such groups spaced apart from one another over the length of said elongated member, means for maintaining the elongated member in the apparatus in a fixed position for bonding together the inner bonding end portion of each conductive portion and a corresponding contact portion of an electrical unit, means including optical means for roughly orienting the contact portions of an electrical unit relative to the ultimate bonding position thereof with respect to inner bonding end portions of a group of conductive portions, means for moving an electrical unit from a roughly oriented position to a position with the contact portions of such unit adjacent the corresponding inner bonding end portions of a conductive portion group and below said inner bonding end portions, said optical means including a microscope and a mirror system disposed away from said microscope, said mirror system comprising at least two mirror means positioned relative to the microscope such that the operator using such microscope is able to view on a line perpendicular to said bonding end portions and said contact portions the relative position of each, means for manipulating the position of the electrical unit in a plane relative to the conductive portions to accomplish precise alignment thereof for bonding, and means for bonding together in a single operation said bonding end portions and said contact portions.

2. Apparatus as defined in claim 1 wherein said optical means having a microscope and a mirror system with at least two mirror means, has one of said mirror means fixed in position above the bonding position for the conductive portions and contact portions and arranged so that the image from said bonding position is provided at right angles to the plane of the material being bonded.

3. Apparatus as defined in claim 1 wherein said mirror means includes one of which is fixed in position and the other is movable on a mounting between two different positions, one position of which is used in viewing an electrical unit in its roughly oriented position, and the other position of which is used in viewing an electrical unit in its bonding position.

4. Apparatus as defined in claim 3 wherein a pivot mount is provided for said movable mirror means, whereby said mirror means can be in one position for the rough orientation of the electrical unit and then pivoted into a second position for the final orientation of an electrical unit and bonding end portions of said conductive portions.

5. Apparatus as defined in claim 1 wherein said means for moving an electrical unit is an arm with a suction end portion thereon to pick up a unit in the rough oriented position and carry it to a bonding unit for the ultimate bonding operation.

6. Apparatus as defined in claim 5 wherein said means for bonding together in a single operation defined in claim 10 includes a bonding post supporting an electrical unit and an anvil above said conductive portions.

7. Apparatus as defined in claim 1 wherein said means for bonding together includes a bonding unit adapted to have an electrical unit maintained on the top thereof, a humper ring at the top portion of the bonding unit with a flange surrounding an electrical unit thereon, with said flange of a height relative to the electrical unit that it engages the conductive portions during a bonding operation.

8. Apparatus as defined in claim 7 wherein said humper ring is maintained under soft spring pressure on said bonding unit to correspondingly press a portion of each conductive portion away from the edge of an electrical unit being bonded to prevent short circuiting between the unit and conductive portions bonding end portions.

9. Apparatus as defined in claim 8 wherein dashpot means is connected to said humper ring to slow the movement thereof vertically on said bonding unit.

References Cited

UNITED STATES PATENTS

| | | | |
|---|---|---|---|
| 3,388,848 | 6/1968 | Youmans et al. | 228—1 |
| 3,395,845 | 8/1968 | Best et al. | 228—1 |
| 3,331,119 | 7/1967 | Gingell et al. | 29—407 |
| 3,451,607 | 6/1969 | Miller et al. | 228—1 |

BENJAMIN A. BORCHELT, Primary Examiner

H. J. TUDOR, Assistant Examiner

U.S. Cl. X.R.

156—580; 228—1